United States Patent
Simin et al.

(10) Patent No.: US 8,338,871 B2
(45) Date of Patent: Dec. 25, 2012

(54) FIELD EFFECT TRANSISTOR WITH ELECTRIC FIELD AND SPACE-CHARGE CONTROL CONTACT

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 118 days.

(21) Appl. No.: 12/645,876

(22) Filed: Dec. 23, 2009

(65) Prior Publication Data
US 2010/0156475 A1   Jun. 24, 2010

Related U.S. Application Data

(60) Provisional application No. 61/203,433, filed on Dec. 23, 2008.

(51) Int. Cl.
*H01L 27/108* (2006.01)
(52) U.S. Cl. ............... 257/296; 257/E29.068; 438/238; 438/239; 438/386; 438/399
(58) Field of Classification Search .................. 257/296
See application file for complete search history.

(56) References Cited

U.S. PATENT DOCUMENTS

| | | |
|---|---|---|
| 4,638,341 A | 1/1987 | Baier et al. |
| 5,126,284 A | 6/1992 | Curran |
| 5,196,907 A | 3/1993 | Birkle et al. |
| 5,241,193 A | 8/1993 | Pfiester et al. |
| 5,552,714 A | 9/1996 | Adamian et al. |
| 6,207,584 B1 | 3/2001 | Shen et al. |
| 6,285,042 B1 | 9/2001 | Ohtani et al. |
| 6,538,538 B2 | 3/2003 | Hreish et al. |
| 6,589,822 B1 | 7/2003 | Yamazaki et al. |
| 6,690,042 B2 | 2/2004 | Khan et al. |
| 6,690,176 B2 | 2/2004 | Toncich |
| 6,759,839 B2 | 7/2004 | Kodato |
| 6,812,714 B2 | 11/2004 | Verspecht et al. |
| 6,878,593 B2 | 4/2005 | Khan et al. |
| 6,903,385 B2 | 6/2005 | Gaska et al. |
| 6,998,833 B2 | 2/2006 | Wang et al. |
| 7,248,866 B1 | 7/2007 | Tsironis |
| 7,282,911 B2 | 10/2007 | Xiang et al. |
| 7,548,069 B2 | 6/2009 | Simpson |
| 7,828,911 B2 | 11/2010 | Gentschev et al. |
| 2001/0009785 A1 | 7/2001 | Arafa et al. |
| 2004/0036086 A1 | 2/2004 | Khan et al. |

(Continued)

FOREIGN PATENT DOCUMENTS
JP   2007048866   2/2007

OTHER PUBLICATIONS

Bradley Smith, "Office Action", U.S. Appl. No. 11/781,308, Notification Date: Apr. 6, 2009, 9 pages.

(Continued)

*Primary Examiner* — Ajay K Arora
(74) *Attorney, Agent, or Firm* — John W. LaBatt; Hoffman Warnick LLC

(57) ABSTRACT

A group III nitride-based transistor capable of achieving terahertz-range cutoff and maximum frequencies of operation at relatively high drain voltages is provided. In an embodiment, two additional independently biased electrodes are used to control the electric field and space-charge close to the gate edges.

22 Claims, 6 Drawing Sheets

U.S. PATENT DOCUMENTS

| | | | |
|---|---|---|---|
| 2004/0061129 | A1 | 4/2004 | Saxler et al. |
| 2005/0001234 | A1 | 1/2005 | Inoue et al. |
| 2005/0173728 | A1 | 8/2005 | Saxler |
| 2005/0274977 | A1 | 12/2005 | Saito et al. |
| 2006/0235638 | A1 | 10/2006 | Verspecht |
| 2006/0279275 | A1 | 12/2006 | Simpson |
| 2007/0278518 | A1 | 12/2007 | Chen et al. |
| 2007/0295993 | A1 | 12/2007 | Chen et al. |
| 2008/0272397 | A1 | 11/2008 | Koudymov et al. |
| 2009/0008804 | A1 | 1/2009 | Standing et al. |
| 2010/0026315 | A1 | 2/2010 | Simpson |

OTHER PUBLICATIONS

Matthew E. Gordon, "Office Action", U.S. Appl. No. 11/781,302, Notification Date: May 1, 2009, 12 pages.

Matthew E. Gordon, "Office Action", U.S. Appl. No. 11/781,302, Notification Date: Mar. 8, 2010, 13 pages.

Matthew E. Gordon, "Final Office Action", U.S. Appl. No. 11/781,302, Notification Date: Aug. 17, 2010, 13 pages.

Raj R. Gupta, "Office Action", U.S. Appl. No. 11/781,338, Notification Date: Mar. 6, 2009, 18 pages.

Raj R. Gupta, "Final Office Action", U.S. Appl. No. 11/781,338, Notification Date: Jul. 10, 2009, 15 pages.

Matthew E. Gordon, "Final Office Action", U.S. Appl. No. 11/781,302, Notification Date: Nov. 17, 2009, 23 pages.

Bradley Smith, "Notice of Allowance", U.S. Appl. No. 11/781,308, Date Mailed: Oct. 20, 2009, 13 pages.

Raj R. Gupta, "Notice of Allowance", U.S. Appl. No. 11/781,338, Date Mailed: Sep. 16, 2009, 10 pages.

Jon Kwon Kim, "PCT International Search Report and Written Opinion", PCT Application No. PCT/US2008/054368, Date of Completion: Jul. 30, 2008, 10 pages.

Sungjae Lee et al., "Record RF performance of 45-nm SOI CMOS Technology", IEDM Technical Digest, pp. 255-258, Copyright 2007.

R. Lai et al., "Sub 50 nm InP HEMT Device with Fmax Greater than 1 THz", IEDM Technical Digest, pp. 609-611, IEEE, Copyright 2007.

Zukauskas et al., "Solid State Lighting", Copyright Wiley 2002, http://nina.ecse.rpi.edu/shur/, 132 pages.

Koudymov et al., "RF Transmission Line Method for Wide-Bandgap Heterostructures", IEEE Electron Device Letters, vol. 30, No. 5, pp. 433-435, May 2009.

Simin et al., "III-Nitride Transistors with Capacitively Coupled Contacts", Applied Physics Letters 89, 033510, pp. 1-3, 2006.

Simin et al., "RF-Enhanced Contacts to Wide-Bandgap Devices", IEEE Electron Device Letters, vol. 28, No. 1, pp. 2-4, Jan. 2007.

Stillman et al., "Closing the Gap: Plasma Wave Electronic Terahertz Detectors", Journal of Nanoelectronics and Optoelectronics, vol. 2, No. 3, pp. 209-221, Dec. 2007.

Foutz et al., "Transient Electron Transport in Wurtzite GaN, InN, and AiN", Journal of Applied Physics, vol. 85, No. 11, pp. 7727-7734, Jun. 1, 1999.

G. Simin, "Wide Bandgap Devices with Non-Ohmic Contacts", ECS 2006—210th Meeting of the Electrochemical Society, Cancun, Mexico, Oct. 29-Nov. 3, 2006, 7 pages.

Pala et al., "Drain-to-Gate Field Engineering for Improved Frequency Response of GaN-based HEMTs", IEEE, 2007, 2 pages.

Turin et al., "Simulations of Field-Plated and Recessed Gate Gallium Nitride-Based Heterojunction Field-Effect Transistors", International Journal of High Speed Electronics and Systems, vol. 17, No. 1, pp. 19-23, 2007.

Mayo Clinic, "HRL InP NMIC GHz", http://www.mayo.edu/sppdg/packaging_development.html, 2 pages.

Simin et al., "High-Power III-Nitride Integrated Microwave Switch with Capacitively-Coupled Contacts", IEEE 2007, pp. 457-460.

Hess and Brennan (1984), Handbook of Semiconductor Parameters, "7.3.2. Transport Properties in High Electric Field", vol. 1, p. 156.

Gordon, U.S. Appl. No. 11/781,302, Office Action Communication, SETI-0033, Jun. 27, 2012, 19 pages.

Benitez, U.S. Appl. No. 12/646,121, Office Action Communication, SETI-0054, Mar. 29, 2012, 23 pages.

Kim, International application No. PCT/US2012/025146, International Search Report and the Written Opinion of the International Searching Authority, Aug. 1, 2012, 9 pages.

Benitez, U.S. Appl. No. 12/646,121, Office Action Communication, Sep. 7, 2012, 17 pages.

Gordon, U.S. Appl. No. 11/781,302, Office Action Communication, Oct. 12, 2012, 19 pages.

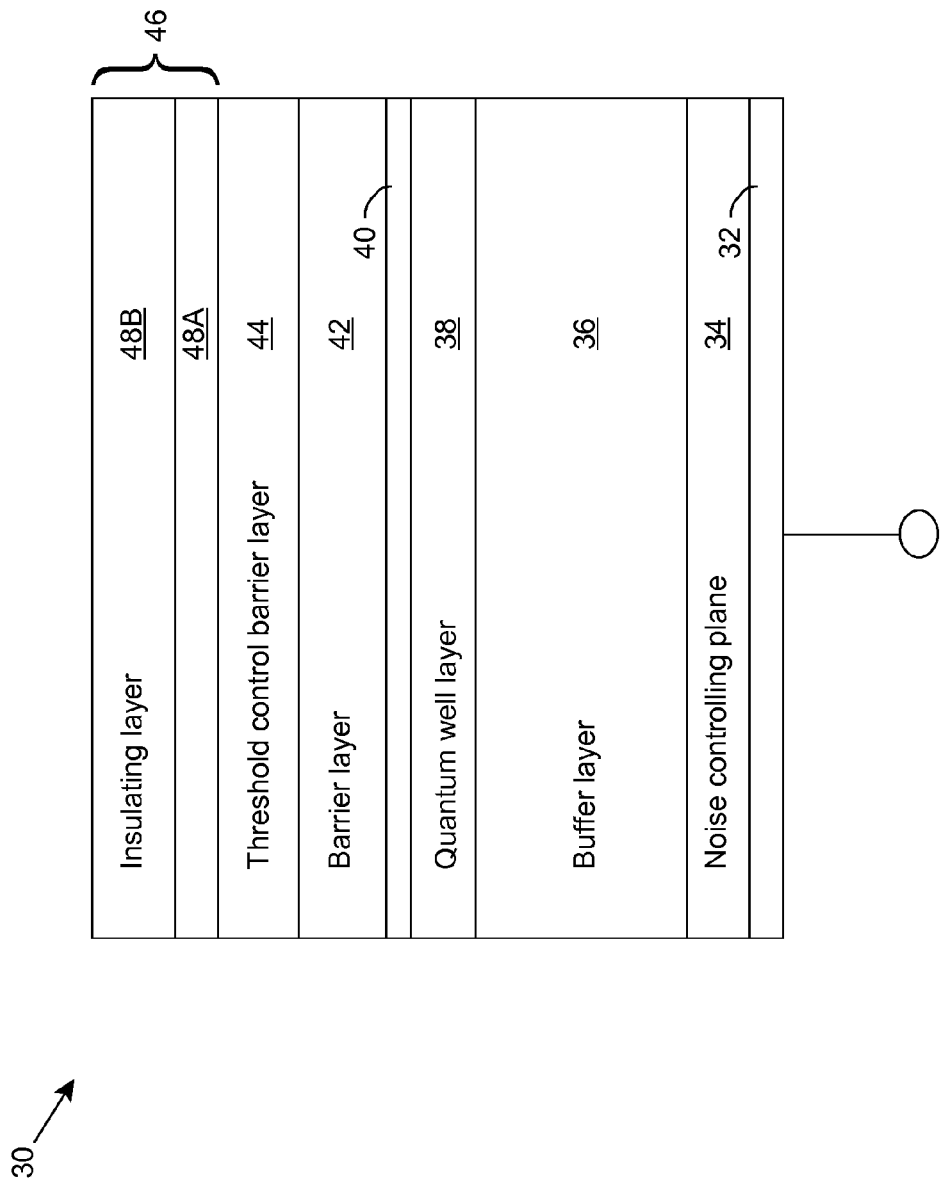

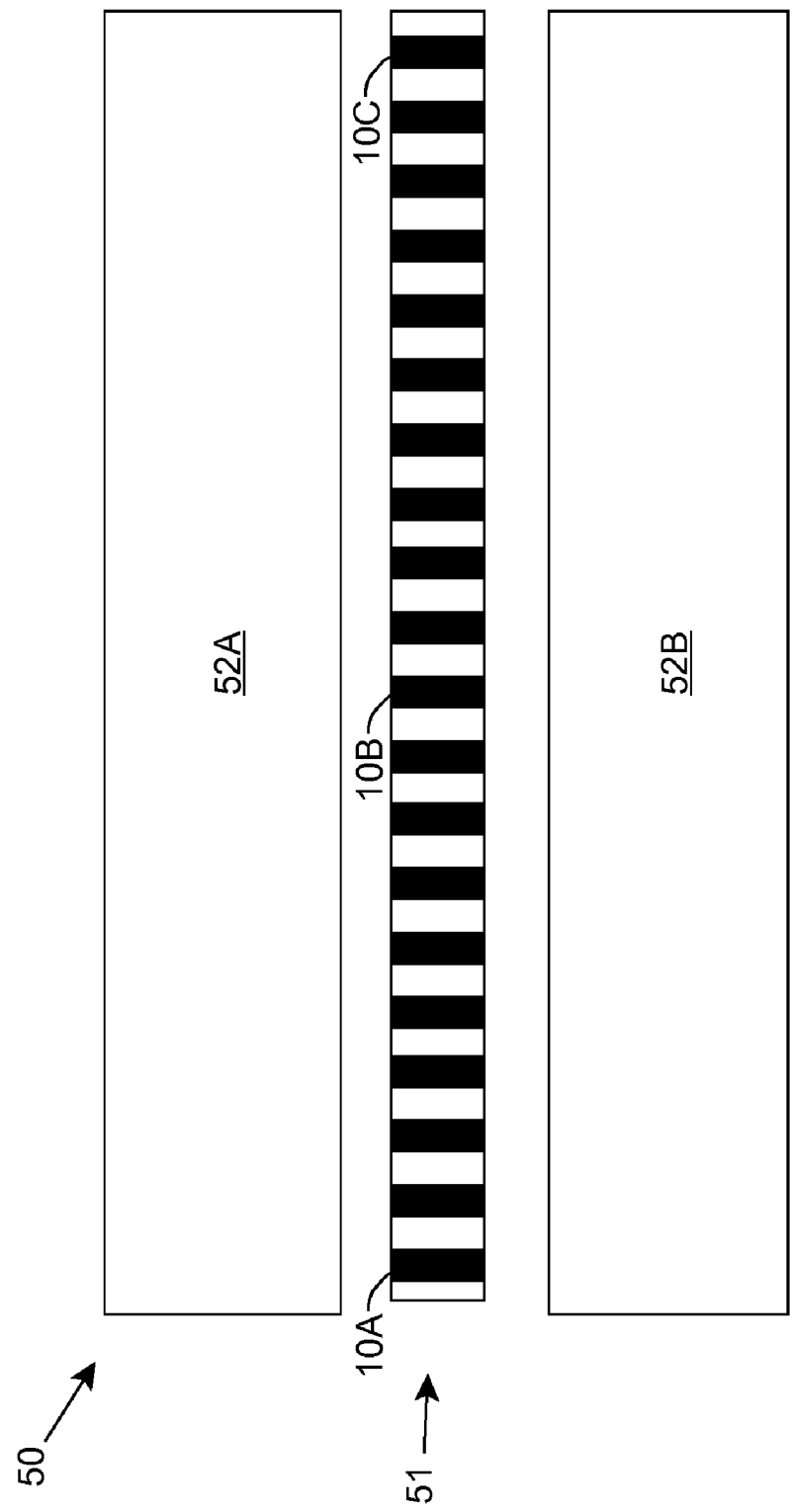

FIELD EFFECT TRANSISTOR WITH ELECTRIC FIELD AND SPACE-CHARGE CONTROL CONTACT

REFERENCE TO PRIOR APPLICATIONS

The current application claims the benefit of co-pending U.S. Provisional Application No. 61/203,433, titled "5-Terminal THz GaN based transistor with field- and space-charge control electrodes", which was filed on 23 Dec. 2008, and which is hereby incorporated by reference.

Aspects of the application are also related to co-pending U.S. Utility application Ser. No. 11/781,302, titled "Composite contact for semiconductor device", which was filed on 23 Jul. 2007, co-pending U.S. Utility application Ser. No. 11/781,308, titled "Fabrication of semiconductor device having composite contact", which was filed on 23 Jul. 2007, and co-pending U.S. Utility application Ser. No. 11/781,338, titled "Enhancement mode insulated gate heterostructure field-effect transistor", which was filed on 23 Jul. 2007, each of which is hereby incorporated by reference.

TECHNICAL FIELD

The disclosure relates generally to transistors, and more particularly, to a nitride-based transistor capable of operating in the terahertz frequency range at relatively high drain voltages.

BACKGROUND ART

Electronic devices operating in the terahertz (THz) frequency range will enable functionality in numerous applications, including radio astronomy, earth remote sensing, radars and vehicle radars, scientific investigations, non-destructive testing of materials and electronic devices, chemical analysis, explosive detection, moisture content, coating thickness control, imaging, wireless covert communications, and/or the like. In spite of great demand for efficient THz devices, compact and efficient transistor THz devices are not yet available.

Achieving electronic device operation in the THz range is a complex multifaceted problem involving the control of electron velocity, electric field and potential profiles, access resistances, parasitic parameters, and electromagnetic coupling. To date, electronic devices such as photomixers and frequency multipliers can only deliver radio frequency (RF) powers in the micro-watt range when operating at frequencies in the THz range. Electronic THz lasers can emit high powers, e.g., up to one Watt, however, these devices are bulky, require high pumping powers and cannot be fabricated using integrated technology.

One of the most important criteria for an efficient THz emission is the peak electron velocity. Of the commonly used III-V materials (materials comprising elements from group III and group V), indium gallium arsenic (InGaAs), indium nitride (InN), and gallium nitride (GaN) have the highest peak electron velocity-electric field dependencies. In very short-gate devices, the average electron velocities under the gate might be considerably higher than the steady state values, due to so-called overshoot effects. The overshoot electron velocities for InN and GaN are expected to be close to the steady state electron velocity of InGaAs. However, in InN material, the electrons reach peak velocities at lower electric fields, thereby allowing for highest average velocities at a longer gate length than GaN-based devices (e.g., approximately three times longer).

High electron mobility transistors (HEMTs) with cutoff frequencies in the THz or sub-THz range have been demonstrated. Advances in silicon (Si) technology, have enabled the fabrication of metal oxide semiconductor (MOS) devices with cutoff frequencies in the lower THz range. However, to date, high power THz operation has not been achieved. Key obstacles to providing high power, high frequency operation include relatively low current density in Si, GaAs and InP based devices, rapid degradation of cutoff frequencies with increasing drain bias (due to short-channel effects), and low operating voltages in devices with submicron inter-electrode spacing.

GaN-based heterostructure field-effect transistors (HFETs) can comprise high electron densities and high peak electron velocity and mobilities in the two-dimensional electron gas (2DEG) channel. These properties indicate a possibility of operation at cut-off frequencies in the THz range with high output powers using nanoscale (e.g., approximately 30 nanometer) gate technology. As a result, GaN-based HFETs are excellent candidates for high-power solid-state THz sources. To date, such operation has not been achieved due to an effective gate length increase when the HFET is operated at high drain bias and access resistances, which causes significant degradation in the maximum and cutoff frequencies.

In particular, the effective gate length of a GaN-based HFET significantly exceeds the physical gate length when the HFET is operated at a high drain bias. The difference is due to an expansion of the 2DEG space charge region into the gate-to-drain spacing as the drain bias is increased. For a GaN-based HFET with an actual gate length of 0.15 μm, the effective gate length reaches 0.25 μm at a drain bias of 14 Volts (V) and approximately 0.5 μm at a 32 V drain bias. One approach incorporates an additional field-controlling electrode (FCE) to a GaN-based HFET, which is located in the near vicinity of the drain-side gate edge to control the extension of the space charge region and thus the cut-off frequencies at high drain bias.

However, limitations relating to the access resistance also restrict the microwave performance of GaN-based HFETs. In GaN devices, the lowest achievable contact resistance values are around an order of magnitude higher than contact resistance values achievable in GaAs devices. Contact annealing in GaN devices also requires much higher temperatures than the temperatures required for GaAs devices, which leads to rough contact edges and requires a larger gate to ohmic spacing to avoid premature breakdown and inter-electrode shortening. The source access resistance, which includes the contact resistance and the source-gate opening resistance, significantly reduces the external transconductance of sub-μm gate GaN devices and leads to lower drain saturation currents. In addition, the total source and drain access resistances increase the knee voltage for a GaN device, thus requiring higher drain voltage to operate the device and to achieve high RF powers. Another problem associated with the access region is depletion of the 2DEG due to surface potential modulation. As a result, the carrier concentration in the channel outside the gate becomes lower than that under the gate at high positive input signals. This leads to lower power gain and to an increase in the effective gate length at large input signals.

One approach seeks to significantly decrease the contact resistance to enable very tight source-gate-drain spacing in GaN-based HFETs by using capacitively coupled contacts. In this approach, a contact was formed directly on the source, and extended beyond the source into the source-gate region. Similarly, a contact was formed directly on the drain, and extended beyond the drain into the drain-gate region. The capacitively coupled contacts are included in microwave HFETs and provide low contact resistance during operation at microwave frequencies and provide independent control of induced carrier concentration in the source-gate and gate-drain openings.

SUMMARY OF THE INVENTION

Aspects of the invention provide a group III nitride-based device capable of achieving terahertz-range cutoff and maximum frequencies of operation at relatively high drain voltages. Two additional independently biased electrodes are used to control the electric field and space-charge close to the gate edges.

A first aspect of the invention provides a device comprising: a field effect transistor including: a device conducting channel; a source contact, a drain contact, and a gate contact to the device conducting channel; a first isolation layer over the source contact, wherein the first isolation layer extends beyond the source contact into only a portion of a spacing between the source contact and the gate contact; and a first capacitive contact to the device conducting channel over the first isolation layer, wherein at least a portion of the first capacitive contact is located within only a portion of the spacing between the source contact and the gate contact and wherein the first capacitive contact is isolated from the source contact by the first isolation layer.

A second aspect of the invention provides a circuit comprising: a field effect transistor including: a device conducting channel; a source contact, a drain contact, and a gate contact to the device conducting channel; a first isolation layer over the source contact, wherein the first isolation layer extends beyond the source contact into only a portion of a spacing between the source contact and the gate contact; and a first capacitive contact to the device conducting channel over the first isolation layer, wherein at least a portion of the first capacitive contact is located within only a portion of the spacing between the source contact and the gate contact and wherein the first capacitive contact is isolated from the source contact by the first isolation layer; and a first bias voltage circuit component electrically connected to the first capacitive contact and configured to apply a first bias voltage to the first capacitive contact independent of operation of the source contact, the drain contact, and the gate contact.

A third aspect of the invention provides a method of operating a field effect transistor comprising: providing a gate control signal to a gate contact of the field effect transistor; providing a source voltage to a source contact of the field effect transistor; and applying a first bias voltage to a first capacitive contact, wherein at least a portion of the first capacitive contact is located within only a portion of a spacing between the source contact and the gate contact, wherein the first capacitive contact is electrically isolated from the source contact, and wherein the first bias voltage is applied independent of the gate control signal and the source voltage.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 4 shows the epitaxial structure of an illustrative heterostructure according to an embodiment, which can be used to fabricate an embodiment of the device of FIG. 1.

FIG. 5 shows an illustrative coplanar waveguide according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a group III nitride-based device capable of achieving terahertz-range cutoff and maximum frequencies of operation at relatively high drain voltages. In an embodiment, two additional independently biased electrodes are used to control the electric field and space-charge close to the gate edges. As a result, an effective gate length extension due to short channel effects is diminished and electron velocity in the device channel is increased. It is understood that for the purposes of the disclosure, Al means Aluminum, As means Arsenic, Ga means Gallium, Hf means Hafnium, In means Indium, O means Oxygen, N means Nitrogen, and Si means Silicon. As used herein, unless otherwise noted, the term "set" means one or more (i.e., at least one) and the phrase "any solution" means any now known or later developed solution.

Figure 1:
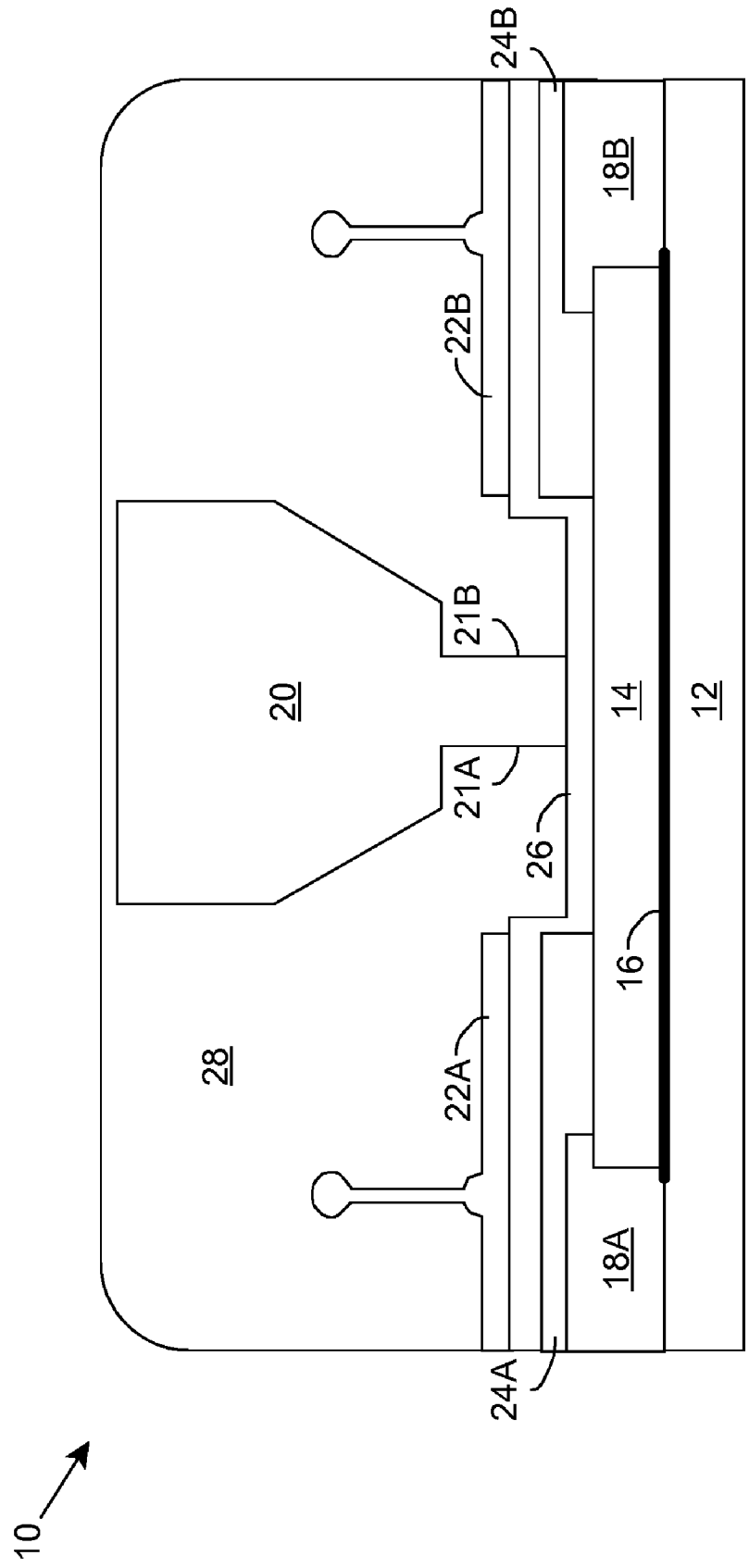
FIG. 1 shows an illustrative device according to an embodiment.

Turning to the drawings, FIG. 1 shows an illustrative device 10 according to an embodiment. Device 10 includes an active layer 12 and a barrier layer 14, with a device conducting channel, such as a two-dimensional electron gas (2DEG, e.g., electron or hole) 16, formed there between. Layers 12, 14 can comprise a portion of a heterostructure, e.g., a group III-Nitride (e.g., GaN) based heterostructure. In an embodiment, the heterostructure comprises an aluminum indium gallium nitride/indium gallium nitride (ALInGaN/InGaN) heterostructure. Device 10 is configured to operate as a field effect transistor (FET), and includes a source contact 18A, a drain contact 18B, and a gate 20. Source contact 18A and drain contact 18B can comprise any type of DC conducting electrode, such as an Ohmic contact (e.g., a low temperature annealed contact) or a Schottky contact and can comprise any material, such as for example, titanium, aluminum, nickel, gold, and/or the like. Similarly, gate 20 can comprise any material, such as for example, titanium, aluminum, nickel, gold, and/or the like.

Device 10 includes a source capacitive contact, such as field controlling electrode 22A, and a drain capacitive contact, such as field controlling electrode 22B, each of which can comprise any material, such as for example, titanium, aluminum, nickel, gold, and/or the like. Electrodes 22A, 22B are located over and extend beyond the corresponding contact 18A, 18B, respectively, towards a corresponding edge 21A, 21B of gate 20 in a direction that is substantially parallel to the 2DEG 16. Electrodes 22A, 22B extend only a portion of the spacing between the gate 20 and the corresponding contact 18A, 18B, respectively. Electrodes 22A, 22B are isolated from the corresponding contact 18A, 18B by isolation layers 24A, 24B, respectively. Similar to electrodes 22A, 22B, each isolation layer 24A, 24B extends only a portion of the spacing between the gate 20 and the corresponding contact 18A, 18B, respectively. Each isolation layer 24A, 24B can comprise any type of a thin insulating layer, such as for example, silicon dioxide, silicon nitride, aluminum oxide, and/or the like.

Additionally, gate 20 and electrodes 22A, 22B are shown formed over a dielectric layer 26, which can comprise a continuous layer between the gate area (e.g., the area under the gate contact 20) and the areas over isolation layers 24A, 24B. Dielectric layer 26 can comprise any type of insulating material, such as for example, silicon dioxide, silicon nitride, $Si_xO_yN_z$ (with $1 \leq x \leq 3$, $0 \leq y \leq 2$ and $0 \leq z \leq 4$), aluminum oxide, and/or the like. In an embodiment, dielectric layer 26 comprises hafnium oxide ($HfO_2$).

As shown and described in more detail in the co-pending U.S. Utility application Ser. No. 11/781,302, titled "Composite contact for semiconductor device", which was filed on 23 Jul. 2007, and which was previously incorporated by reference, use of electrodes 22A, 22B along with contacts 18A, 18B provides a combined resistive-capacitive coupling to a semiconductor layer, which reduces a contact impedance when device 10 is operated at high frequencies and can generate a maximum oscillation frequency largely insensitive to DC contact resistance. Device 10 can be manufactured using any solution.

In an embodiment, a solution similar to that shown and described in the co-pending U.S. Utility application Ser. No. 11/781,308, titled "Fabrication of semiconductor device having composite contact", which was filed on 23 Jul. 2007, and which was previously incorporated by reference, is used to manufacture the device 10. However, the capacitive electrode described therein is configured to be isolated from the DC conducting electrode as much as possible when operated at radio frequencies. To this extent, the capacitive electrode described therein meets a requirement that the contact resistance multiplied by the overlap capacitance is much smaller than $1/(2\pi f_O)$, where $f_O$ is the operating frequency in hertz. In contrast, electrodes 22A, 22B are isolated from contacts 18A, 18B when a DC voltage bias is applied to electrodes 22A, 22B. However, when operated at radio frequencies, electrodes 22A, 22B are short circuited with the corresponding contacts 18A, 18B, respectively.

Regardless, a contact 18A, 18B can be formed by depositing and annealing a metal (e.g., Ohmic) contact to a semiconductor layer. During formation of the metal contact 18A, 18B, a high annealing temperature may not be required since achieving a low DC contact resistance may not be essential. Alternatively, the metal contact 18A, 18B may be formed without annealing, thereby forming a Schottky contact. Subsequently, one or more insulating layers, such as isolation layers 24A, 24B and/or dielectric layer 26 can be formed (e.g., deposited) over the contacts 18A, 18B. An electrode 22A, 22B having a portion over the corresponding metal contact 18A, 18B and a portion extending beyond the corresponding metal contact 18A, 18B can be formed (e.g., deposited). Formation of the electrode 22A, 22B can be combined with additional processing, such as the formation of the gate 20 or another electrode for the structure/device, thereby allowing for an alignment-free formation process and/or tight spacing.

Device 10 is also shown including an encapsulation layer 28. Encapsulation layer 28 can comprise a high dielectric strength insulating material that increases a breakdown voltage of device 10, thereby helping to prevent a premature breakdown of device 10. The material can have a high breakdown field that well exceeds that of air and is close to that of the material constituting device 10. Illustrative examples of materials for encapsulating layer 28 include silicon dioxide, silicon nitride, bisbenzocyclobutene, and/or the like.

Figure 2:
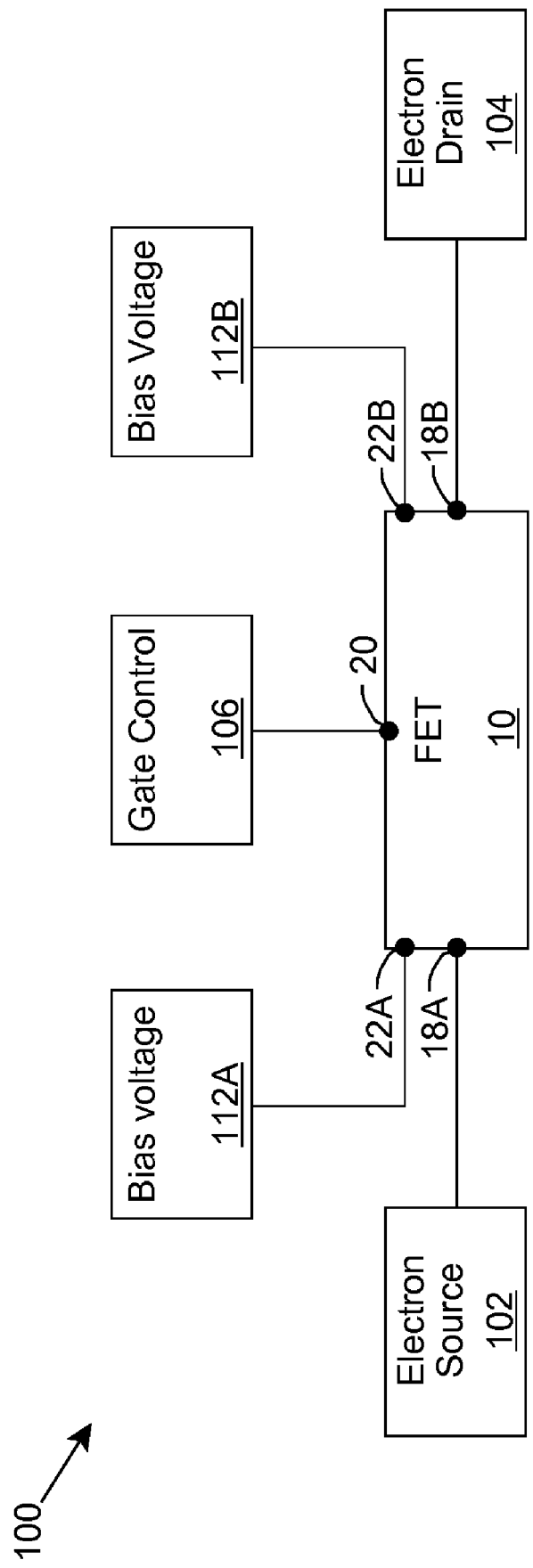
FIG. 2 shows an illustrative circuit according to an embodiment.

Device 10 can be included as a field effect transistor within a circuit. To this extent, FIG. 2 shows an illustrative circuit 100 according to an embodiment. In circuit 100, source contact 18A and drain contact 18B of device 10 are electrically connected to an electron source circuit component 102 and an electron drain circuit component 104, respectively, within the circuit 100. Gate 20 is electrically connected to a gate control circuit component 106 used to generate a signal that controls the current flow from source contact 18A to drain contact 18B within device 10, and therefore the current flow between electron source circuit component 102 and electron drain circuit component 104. Each electrode 22A, 22B of device 10 is electrically connected to a corresponding bias voltage source 112A, 112B, respectively, each of which is operated independent of the circuit components 102, 104, and 106, and each of which applies a bias voltage to the corresponding electrode 22A, 22B. Further, each bias voltage source 112A, 112B can be operated independent of the other bias voltage source 112A, 112B.

During operation of device 10, electrodes 22A, 22B can be independently biased to control the electron field and space-charge close to the gate 20 edges 21A, 21B (shown in FIG. 1), respectively. The voltage bias applied to each electrode 22A, 22B can be selected based on the dimensions of device 10. In an illustrative embodiment, the voltage bias applied to electrode 22A is in a range of zero to ten volts, and the bias voltage applied to electrode 22B is in a range of zero to ten volts below a voltage applied to drain 18B. Inclusion of both electrodes 22A, 22B enables such control on both the source and drain sides of the gate 20 and fundamentally changes the performance of device 10 at THz frequencies. In particular, the additional bias voltages applied to the electrodes 22A, 22B increase the electron concentration and velocity at the source contact 18A edge of the 2DEG 16 and control the space-charge spread at the drain contact 18B edge of the 2DEG 16. As a result, the electron velocity under the gate 20 is increased, and the space-charge penetration into the gate-drain region is minimized.

The inventors conducted simulations for the operation of an illustrative device 10 using Agilent's ADS circuit simulation software. In the simulation, a MOSFET level 3 model was used to simulate the intrinsic HFET. The model input data were recalculated using parameters specific for a GaN HFET, such as 2DEG equilibrium sheet density, threshold voltage, barrier and dielectric thickness, etc. The access regions were simulated using an equivalent circuit of the RF-enhanced contacts extracted from MATLAB simulations as shown and described in U.S. Utility application Ser. No. 11/781,302.

In the simulations, the gate 20 comprises a geometrical length of thirty nanometers and width of fifteen micrometers. For simulations of HFETs without electrodes 22A, 22B, the effective gate length was dependent on the drain bias voltage, increasing from thirty nanometers at a drain bias of zero volts to eighty nanometers at a drain bias of twelve volts. For the simulations of device 10, the gate length was kept at the geometrical length of thirty nanometers independent of the drain bias.

Figure 3A:
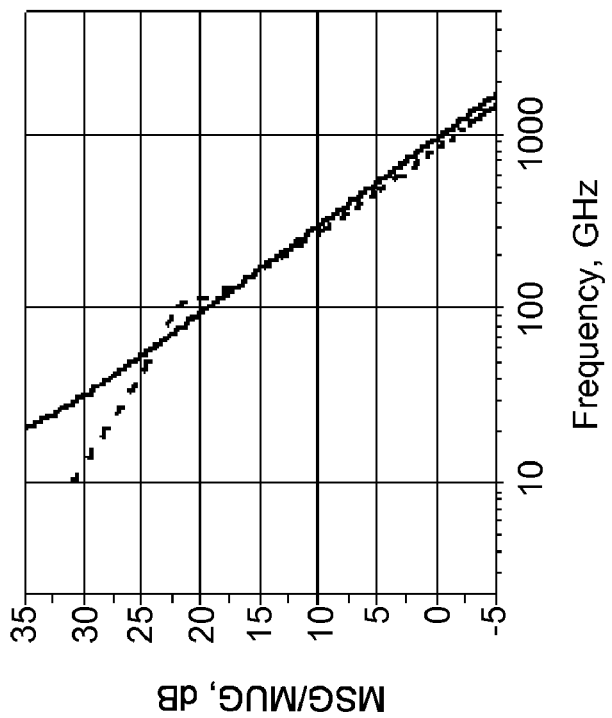
FIGS. 3A, 3B show simulation results for current and power gain, respectively, as a function of frequency for a simulated traditional HFET and an embodiment of the device of FIG. 1 according to an embodiment.
Figure 3B:
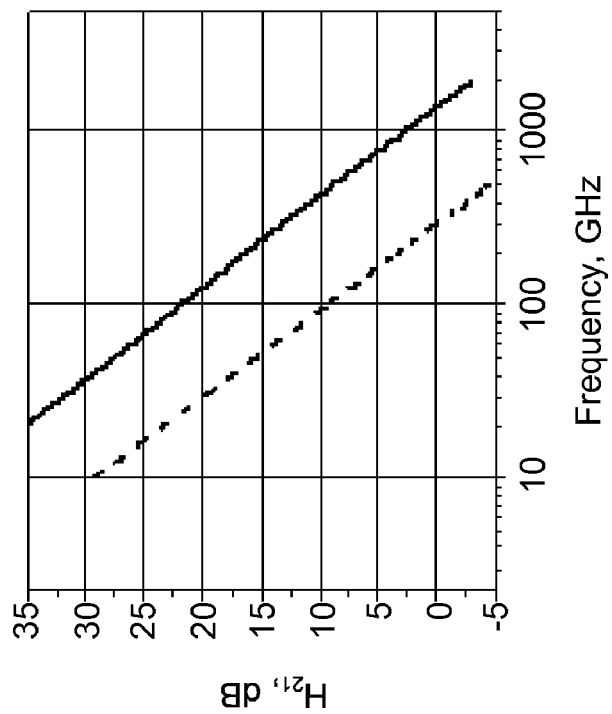

The effective electron velocity was estimated using the electric field distribution under the gate 20 and in the depletion region in the spacing between gate 20 and drain 18B, which can be obtained by 2D-modeling. The estimation indicates an effective electron velocity of $v_m = 1.5 \times 10^7$ cm/s for the HFET without electrodes 22A, 22B, and an effective electron velocity of $v_m=2.7\times10^7$ cm/s for device 10. FIGS. 3A, 3B show simulation results for current and power gain, respectively, as a function of frequency for the simulated HFET without electrodes 22A, 22B (dashed line) and device 10 (solid line) according to an embodiment. As illustrated, the simulation results indicate that device 10 can achieve a threshold frequency, $f_T$, =1.28 THz and a maximum frequency, $f_{max}$, =0.815 THz at drain bias voltages as high as twelve volts. Both frequencies exceed those achieved with an identical HFET without electrodes 22A, 22B, for which $f_T$=300 GHz and $f_{max}$=700 GHz. As a result, device 10 can provide a new solution for fabricating high-power THz transistor sources.

As discussed herein, device 10 can comprise a heterostructure device, e.g., a group III-Nitride (e.g., GaN) based heterostructure device. To this extent, FIG. 4 shows the epitaxial structure of an illustrative heterostructure 30 according to an embodiment, which can be used to fabricate an embodiment of device 10 (FIG. 1). Referring to FIGS. 1 and 4, when used to fabricate device 10, heterostructure 30 can lead to depletion of the 2DEG 16 under equilibrium bias conditions of gate 20 during operation of the device 10, which results in normally-off operation of device 10.

Heterostructure 30 includes a threshold voltage controlling plane 32 and a noise controlling plane 34. Threshold voltage controlling plane 32 can comprise a metal, such as for example, titanium, aluminum, nickel, gold, and/or the like. Noise controlling plane 34 can comprise a p+ GaN plane. Buffer layer 36 can be configured to decrease the threshold voltage and control short channel and current collapse effects of the resulting device 10. In an embodiment, buffer layer 36 comprises a p− GaN layer. Quantum well layer 38 can comprise an InGaN quantum well, and a confinement layer 40 can comprise an approximately one nanometer thick layer of AlN to confine the quantum well.

Heterostructure 30 also includes a barrier layer 42, which can comprise ALInGaN, and a threshold control barrier layer 44, which can comprise p− AlInGaN. The negative charge of the acceptor impurities introduced in the buffer layer 36 and the threshold control barrier layer 44 repeals the electrons from the quantum well at the ALInGaN/GaN interface. Further, heterostructure 30 includes an insulating stack 46 to suppress gate leakage during operation of the resulting device 10. To this extent, insulating stack 46 includes one or more insulating (e.g., dielectric) layers 48A, 48B. For example, layer 48A can comprise silicon dioxide, and layer 48B can comprise hafnium oxide. However, it is understood that various alternative configurations of insulating stack 46 can be implemented. For example, insulating stack 46 can comprise only layer 48B.

To fabricate a recessed gate device using heterostructure 30, a n-doped barrier layer can be added over the p− threshold control barrier layer 44 and under the insulating stack 46 to compensate for negative acceptor charges and to restore the 2DEG. In this case, the n-doped barrier layer will be removed during the gate recessing process. The gate recessing process used in fabricating nitride-based transistors typically includes etching the AlInGaN layers, such as barrier layers 42, 44. Such etching can lead to significant mobility degradation and therefore can result in a deterioration of the high-frequency performance for the device.

Device 10 can be configured for enhancement mode operation. To this extent, device 10 can be configured and manufactured using heterostructure 30 as shown and described in the co-pending U.S. Utility application Ser. No. 11/781,338, titled "Enhancement mode insulated gate heterostructure field-effect transistor", which was filed on 23 Jul. 2007, and which was previously incorporated by reference. Enhancement mode operation of a device 10 fabricated using heterostructure 30 can be achieved using the electrodes 22A, 22B (e.g., capacitively coupled contacts) extending into the source-gate and gate-drain spacings as described herein. A positive bias voltage applied to these electrodes 22A, 22B induces the 2DEG 16 in the transistor access regions, while the 2DEG 16 is fully depleted under the gate 20 at zero gate bias voltage. In this manner, the device 10 can perform similar to that of a recessed gate device, however, the AlInGaN layers do not require etching.

Bottom metallization of the device 10 (e.g., by inclusion of threshold voltage controlling plane 32) can provide an additional control to adjust the threshold voltage of device 10. In particular, a circuit component can apply a bias voltage between the bottom metal (e.g., threshold voltage controlling plane 32) and the source electrode 22A. The threshold voltage can be tuned by changing the channel potential with respect to the gate electrode 20. For example, the voltage can be estimated as the tuning electric field multiplied by the distance between the channel and the electrode 32.

Additionally, at THz frequencies, the top and bottom surfaces form a Fabry-Perot resonator with multiple reflections, which enhance the electro-magnetic wave interaction for the device 10. To this extent, the THz generation, amplification, and/or detection efficiency is also enhanced for the device 10.

Figure 6:
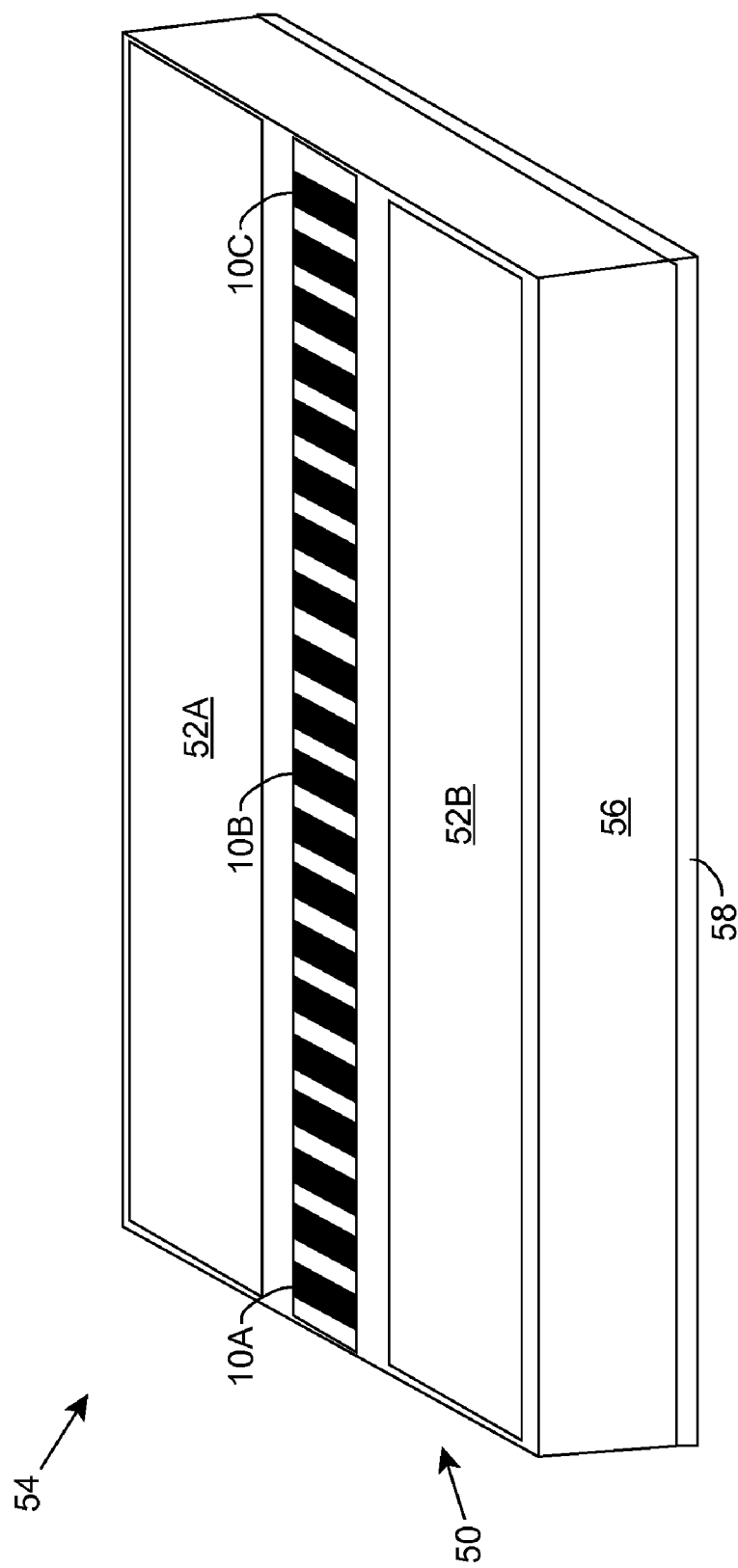
FIG. 6 shows an illustrative combined Fabry-Perot coplanar waveguide according to an embodiment.

Device 10 can be implemented as part of various devices/circuits. For example, an embodiment of the invention provides a coplanar waveguide fabricated using multiple devices 10. To this extent, FIG. 5 shows an illustrative coplanar waveguide 50 according to an embodiment. As illustrated, waveguide 50 includes a conductor 51 formed using a plurality of spaced devices 10 (indicated by solid areas, such as devices 10A, 10B, 10C, located between two ground planes 52A, 52B. Similarly, coplanar waveguide 50 can be used in conjunction with bottom metallization to form a combined Fabry-Perot coplanar waveguide. To this extent, FIG. 6 shows an illustrative combined Fabry-Perot coplanar waveguide device 54 according to an embodiment. As illustrated, coplanar waveguide 50 is fabricated on a first side of a dielectric medium 56 of device 54, and a bottom ground and Fabry-Perot mirror 58 is fabricated on an opposing side of the dielectric medium 56. The dielectric medium 56 can comprise a semi-insulating semiconductor material, a combination of the semi-insulating semiconductor material with dielectrics such as oxides, nitrides, etc., and/or the like. Mirror 58 can comprise any type of reflecting layer, such as a metal layer, e.g., Aluminum, or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
    a field effect transistor including:
        a device conducting channel;
        a source contact, a drain contact, and a gate contact to the device conducting channel;
        a first isolation layer over the source contact, wherein the first isolation layer extends beyond the source contact into only a portion of a spacing between the source contact and the gate contact; and a first capacitive contact to the device conducting channel over the first isolation layer, wherein a portion of the first capacitive contact extends beyond the source contact, wherein the portion of the first capacitive contact is located within only a portion of the spacing between the source contact and the gate contact and is substantially parallel to the device conducting channel, and wherein the first capacitive contact is isolated from the source contact by the first isolation layer.

2. The device of claim 1, wherein the device conducting channel is formed in a heterostructure.

3. The device of claim 2, the heterostructure including:
a buffer layer comprising negatively charged acceptor impurities;
a quantum well layer over the buffer layer; and
a barrier layer over the quantum well layer comprising negatively charged acceptor impurities, wherein the source contact, the drain contact, the gate contact, and the first capacitive contact are over the quantum well layer.

4. The device of claim 3, the heterostructure further including a threshold voltage controlling plane, wherein the buffer layer is over the threshold voltage controlling plane.

5. The device of claim 1, further comprising:
a first ground plane on a dielectric medium;
a second ground plane on the dielectric medium; and
a conductor located between the first and second ground planes on the dielectric medium, wherein the conductor includes the field effect transistor.

6. The device of claim 5, further comprising a mirror located on an opposing side of the dielectric medium.

7. The device of claim 3, wherein the heterostructure is a group III-nitride heterostructure.

8. A device comprising:
a field effect transistor including:
a device conducting channel;
a source contact, a drain contact, and a gate contact to the device conducting channel;
a first isolation layer over the source contact, wherein the first isolation layer extends beyond the source contact into only a portion of a spacing between the source contact and the gate contact;
a first capacitive contact to the device conducting channel over the first isolation layer, wherein at least a portion of the first capacitive contact is located within only a portion of the spacing between the source contact and the gate contact and wherein the first capacitive contact is isolated from the source contact by the first isolation layer;
a second isolation layer over the drain contact, wherein the second isolation layer extends beyond the drain contact into only a portion of a spacing between the drain contact and the gate contact; and
a second capacitive contact to the device conducting channel over the second isolation layer, wherein at least a portion of the second capacitive contact is located within only a portion of the spacing between the drain contact and the gate contact and wherein the second capacitive contact is isolated from the drain contact by the second isolation layer.

9. A circuit comprising:
a field effect transistor including:
a device conducting channel;
a source contact, a drain contact, and a gate contact to the device conducting channel;
a first isolation layer over the source contact, wherein the first isolation layer extends beyond the source contact into only a portion of a spacing between the source contact and the gate contact; and
a first capacitive contact to the device conducting channel over the first isolation layer, wherein at least a portion of the first capacitive contact is located within only a portion of the spacing between the source contact and the gate contact and wherein the first capacitive contact is isolated from the source contact by the first isolation layer; and
a first bias voltage circuit component electrically connected to the first capacitive contact and configured to apply a first bias voltage to the first capacitive contact independent of operation of the source contact, the drain contact, and the gate contact.

10. The circuit of claim 9, wherein the transistor further includes:
a second isolation layer over the drain contact, wherein the second isolation layer extends beyond the drain contact into only a portion of a spacing between the drain contact and the gate contact; and
a second capacitive contact to the device conducting channel over the second isolation layer, wherein at least a portion of the second capacitive contact is located within only a portion of the spacing between the drain contact and the gate contact and wherein the second capacitive contact is isolated from the drain contact by the second isolation layer; and
wherein the circuit further includes a second bias voltage circuit component electrically connected to the second capacitive contact and configured to apply a second bias voltage to the second capacitive contact independent of operation of the source contact, the drain contact, and the gate contact.

11. The circuit of claim 9, wherein the device conducting channel is formed in a group III-nitride heterostructure.

12. The circuit of claim 11, the heterostructure including a threshold voltage controlling plane, wherein the first bias voltage circuit is configured to apply the bias voltage between the threshold voltage controlling plane and the first capacitive contact.

13. The device of claim 11, the heterostructure including:
a buffer layer comprising negatively charged acceptor impurities;
a quantum well layer over the buffer layer; and
a barrier layer over the quantum well layer comprising negatively charged acceptor impurities, wherein the source contact, the drain contact, the gate contact, and the first capacitive contact are over the quantum well layer.

14. A device comprising:
a field effect transistor including:
a device conducting channel;
a source contact, a drain contact, and a gate contact to the device conducting channel;
a first isolation layer over the source contact, wherein the first isolation layer extends beyond the source contact into only a portion of a spacing between the source contact and the gate contact; and
a first capacitive contact to the device conducting channel over the first isolation layer, wherein at least a portion of the first capacitive contact is located within only a portion of the spacing between the source contact and the gate contact and wherein the first capacitive contact is isolated from the source contact by the first isolation layer;
a first ground plane on a dielectric medium;
a second ground plane on the dielectric medium; and a conductor located between the first and second ground planes on the dielectric medium, wherein the conductor includes the field effect transistor.

15. The device of claim 14, wherein the device conducting channel is formed in a heterostructure.

16. The device of claim 15, the heterostructure including:
a buffer layer comprising negatively charged acceptor impurities;
a quantum well layer over the buffer layer; and
a barrier layer over the quantum well layer comprising negatively charged acceptor impurities, wherein the source contact, the drain contact, the gate contact, and the first capacitive contact are over the quantum well layer.

17. The device of claim 16, the heterostructure further including a threshold voltage controlling plane, wherein the buffer layer is over the threshold voltage controlling plane.

18. A device comprising:
a field effect transistor including:
a device conducting channel formed in a heterostructure;
a source contact, a drain contact, and a gate contact to the device conducting channel;
a first isolation layer over the source contact, wherein the first isolation layer extends beyond the source contact into only a portion of a spacing between the source contact and the gate contact; and
a first capacitive contact to the device conducting channel over the first isolation layer, wherein at least a portion of the first capacitive contact is located within only a portion of the spacing between the source contact and the gate contact and wherein the first capacitive contact is isolated from the source contact by the first isolation layer, wherein the heterostructure includes:
a buffer layer comprising negatively charged acceptor impurities;
a quantum well layer over the buffer layer; and
a barrier layer over the quantum well layer, the barrier layer comprising negatively charged acceptor impurities, wherein the source contact, the drain contact, the gate contact, and the first capacitive contact are over the quantum well layer.

19. The device of claim 18, wherein the heterostructure is a group III-nitride heterostructure.

20. The device of claim 18, the heterostructure further including a threshold voltage controlling plane, wherein the buffer layer is over the threshold voltage controlling plane.

21. The device of claim 18, the transistor further including:
a second isolation layer over the drain contact, wherein the second isolation layer extends beyond the drain contact into only a portion of a spacing between the drain contact and the gate contact; and
a second capacitive contact to the device conducting channel over the second isolation layer, wherein at least a portion of the second capacitive contact is located within only a portion of the spacing between the drain contact and the gate contact and wherein the second capacitive contact is isolated from the drain contact by the second isolation layer.

22. The device of claim 18, further comprising:
a first ground plane on a dielectric medium;
a second ground plane on the dielectric medium; and
a conductor located between the first and second ground planes on the dielectric medium, wherein the conductor includes the field effect transistor.

* * * * *